United States Patent
Sakai

(10) Patent No.: US 7,455,030 B2
(45) Date of Patent: Nov. 25, 2008

(54) PLASMA GENERATING APPARATUS

(75) Inventor: Shigeki Sakai, Kyoto (JP)

(73) Assignee: Nissin Ion Equipment Co., Ltd., Kyoto (JP)

(*) Notice: Subject to any disclaimer, the term of this patent is extended or adjusted under 35 U.S.C. 154(b) by 0 days.

(21) Appl. No.: 12/043,319

(22) Filed: Mar. 6, 2008

(65) Prior Publication Data

US 2008/0218086 A1   Sep. 11, 2008

(30) Foreign Application Priority Data

Mar. 6, 2007   (JP) .............................. 2007-056002

(51) Int. Cl.
C23C 16/00 (2006.01)

(52) U.S. Cl. ............... 118/723 I; 118/712; 156/345.28; 315/111.21

(58) Field of Classification Search ............ 315/111.21, 315/111.31, 111.41, 111.71, 111.81; 118/723 I, 118/712, 723 IR; 156/345.28, 345.24; 204/298.31, 204/298.32
See application file for complete search history.

(56) References Cited

U.S. PATENT DOCUMENTS

| | | | | |
|---|---|---|---|---|
| 6,297,594 B1 * | 10/2001 | Sakai et al. | ............ | 315/111.21 |
| 6,439,154 B2 * | 8/2002 | Fukuda et al. | ............ | 118/723 I |
| 6,548,381 B2 * | 4/2003 | Hamamoto | ................. | 438/514 |
| 6,796,269 B2 * | 9/2004 | Sasaki et al. | ........... | 156/345.28 |
| 2006/0063284 A1 * | 3/2006 | Shuto et al. | ................... | 438/15 |

FOREIGN PATENT DOCUMENTS

| | | |
|---|---|---|
| JP | 8-31358 | 2/1996 |
| JP | 9-111460 | 4/1997 |
| JP | 9-245997 | 9/1997 |
| JP | 2000-40475 | 2/2000 |
| JP | 2000-223299 | 8/2000 |
| JP | 2002-170516 | 6/2002 |
| JP | 2002-324511 | 11/2002 |
| JP | 2003-173757 | 6/2003 |
| JP | 2006-93342 | 4/2006 |

* cited by examiner

Primary Examiner—Douglas W. Owens
Assistant Examiner—Ephrem Alemu
(74) Attorney, Agent, or Firm—Osha•Liang LLP

(57) ABSTRACT

A plasma generating apparatus is provided with a plasma generating apparatus for ionizing gas by high frequency discharge within a plasma generating container to thereby generate a plasma and for discharging the plasma to the outside through a plasma discharge hole, an antenna disposed within the plasma generating container for radiating a high frequency wave, an antenna cover made of an insulator and covering a whole of the antenna, a DC voltage measuring device for measuring a DC voltage between the antenna and the plasma generating container, and a comparator for comparing the DC voltage with a reference value, and outputting an alarm signal when an absolute value of the DC voltage value is larger than the absolute value of the reference value.

2 Claims, 7 Drawing Sheets

PLASMA GENERATING APPARATUS

The present invention claims priority from Japanese Patent Application No. 2007-056002 filed on Mar. 6, 2007, the entire content of which is incorporated herein by reference.

BACKGROUND OF INVENTION

1. Field of the Invention

The present invention relates to a high frequency discharge type of a plasma generating apparatus. The plasma generating apparatus controls the charge-up of the surface of the substrate in the ion beam radiation in an ion beam radiation apparatus for radiating an ion beam onto a substrate to enforce an ion implantation processing.

2. Description of the Related Art

As a high frequency discharge type of a plasma generating apparatus is used to control the charge-up of the surface of the substrate, in JP-A-2002-324511 (see e.g., Paragraph 0031-0038, FIG. 1). There is disclosed a plasma generating apparatus ionizes gas within a plasma generating container by high frequency discharge to thereby generate a plasma and also discharges the plasma to the outside through a plasma discharge hole. And also, the plasma generating apparatus includes an antenna disposed within the plasma generating container for radiating a high frequency wave. And an antenna cover composed of an insulator for covering the whole of the antenna disposed within the plasma generating container.

The antenna cover prevents the plasma from contamination with the metal particles (that is, metallic contamination) that are discharged from the antenna when the antenna is sputtered with the plasma.

However, in some cases, when the plasma generating apparatus is operated for a long period of time (for example, several hundreds of hours~several thousands of hours), the antenna cover may fuse in part and the antenna may be exposed in the fused area of the antenna cover. Then, the antenna may be exposed to the plasma. As a result, it occurs the metallic contamination of the plasma.

The following presumption may probably account for the above phenomenon. That is, standing high frequency waves are generated along the antenna within the plasma generating container, the electric field becomes greatest in the middle portion of the standing high frequency waves, and electrons and ions contained in the plasma are strongly accelerated toward the antenna. When the plasma generating apparatus is operated for a long period of time in the manner, owing to the sputtering of the electrons and ions, the antenna cover may be shaved in part and may be thereby fused.

Suppose that the antenna cover is fused in the manner, the conventional plasma generating apparatus does not include an apparatus for detecting such fused condition. When keeping on the operation of the plasma generating apparatus, the metallic contamination of the plasma occurs while an operator may not detect it. When such metallic contamination occurs once, the substrate may also be contaminated by using the present plasma generating apparatus of the ion beam radiating apparatus.

SUMMARY OF INVENTION

One or more embodiments of the invention provide a high frequency discharge type plasma generating apparatus which can immediately detect a fusion of an antenna cover.

According to a first aspect of the invention, the plasma generating apparatus is provided with a plasma generating apparatus for ionizing gas by high frequency discharge within a plasma generating container to thereby generate a plasma and for discharging the plasma to the outside through a plasma discharge hole, an antenna whose opposite end of a high frequency input end is open end, disposed within the plasma generating container for radiating a high frequency wave, an antenna cover made of an insulator and covering a whole of the antenna, a DC voltage measuring device for measuring a DC voltage between the antenna and the plasma generating container, and a comparator for comparing the DC voltage with a reference value, and outputting an alarm signal when an absolute value of the DC voltage value is larger than the absolute value of the reference value.

When the antenna cover is fused, the plasma exposes the antenna in the fused area of the antenna cover. DC voltage generates equivalent to a plasma potential. When the antenna cover is normal, there is not generated such DC voltage. Therefore, the DC voltage measuring device and comparator detect the fusion of the antenna cover immediately when it occurs and thus output an alarm signal.

According to a second aspect of the invention, the plasma generating apparatus is provided with a plasma generating apparatus for ionizing gas by high frequency discharge within a plasma generating container to thereby generate a plasma and for discharging the plasma to the outside through a plasma discharge hole, an antenna whose opposite end of a high frequency input end is open end, disposed within the plasma generating container for radiating a high frequency wave, an antenna cover made of an insulator and covering a whole of the antenna, a DC resistance measuring device for measuring a DC resistance between the antenna and the plasma generating container, and a comparator for comparing the DC resistance with a reference value, and outputting an alarm signal when an absolute value of the DC resistance is smaller than an absolute value of the reference value.

When the antenna cover is fused, the plasma exposes the antenna in the fused area of the antenna cover. Thus, the plasma which is electrically similar to a conductor allows the antenna and plasma generating container to electrically conduct to each other. The DC resistance greatly reduces between the antenna and plasma generating container. When the antenna cover is normal, the DC resistance is very large. Therefore, the DC resistance measuring device and comparator may immediately detect the fusion of the antenna cover when it occurs and thus may output an alarm signal.

According to the first aspect of the invention, since the plasma generating apparatus includes the DC voltage measuring device and comparator, the plasma generating apparatus may immediately detect the fusion of the antenna cover when it occurs and thus may output an alarm signal. As a result, it is possible to prevent the occurrence of the metallic contamination of the plasma that may be otherwise caused by the plasma sputtering the antenna.

According to the second aspect of the invention, since the plasma generating apparatus includes the DC resistance measuring device and comparator, the plasma generating apparatus may immediately detect the fusion of the antenna cover when it occurs and thus may output an alarm signal. As a result, it is possible to prevent the occurrence of the metallic contamination of the plasma that may be otherwise caused by the plasma sputtering the antenna.

Other aspects and advantages of the invention will be apparent from the following description and the appended claims.

DESCRIPTION OF EXEMPLARY EMBODIMENTS

First Embodiment

Figure 1:
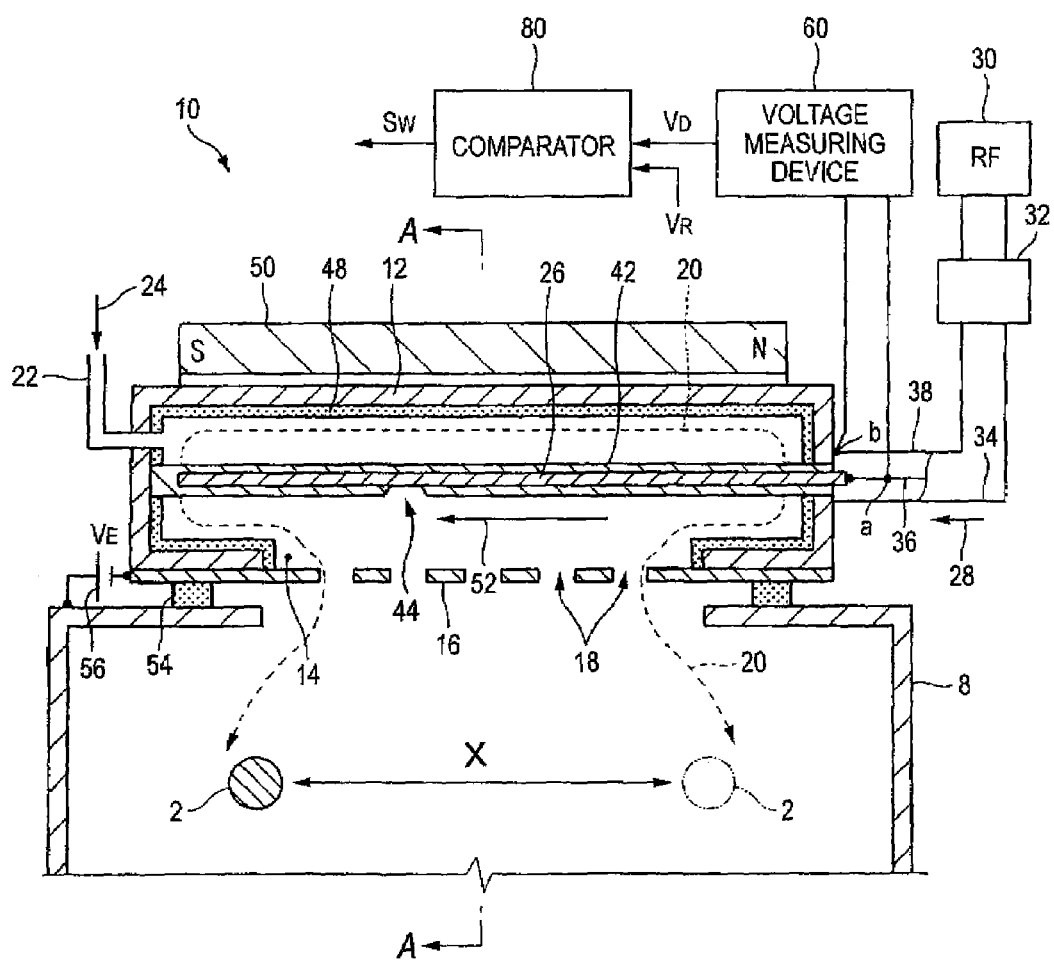
FIG. 1 is a section view of a plasma generating apparatus according to a first embodiment.
Figure 2:
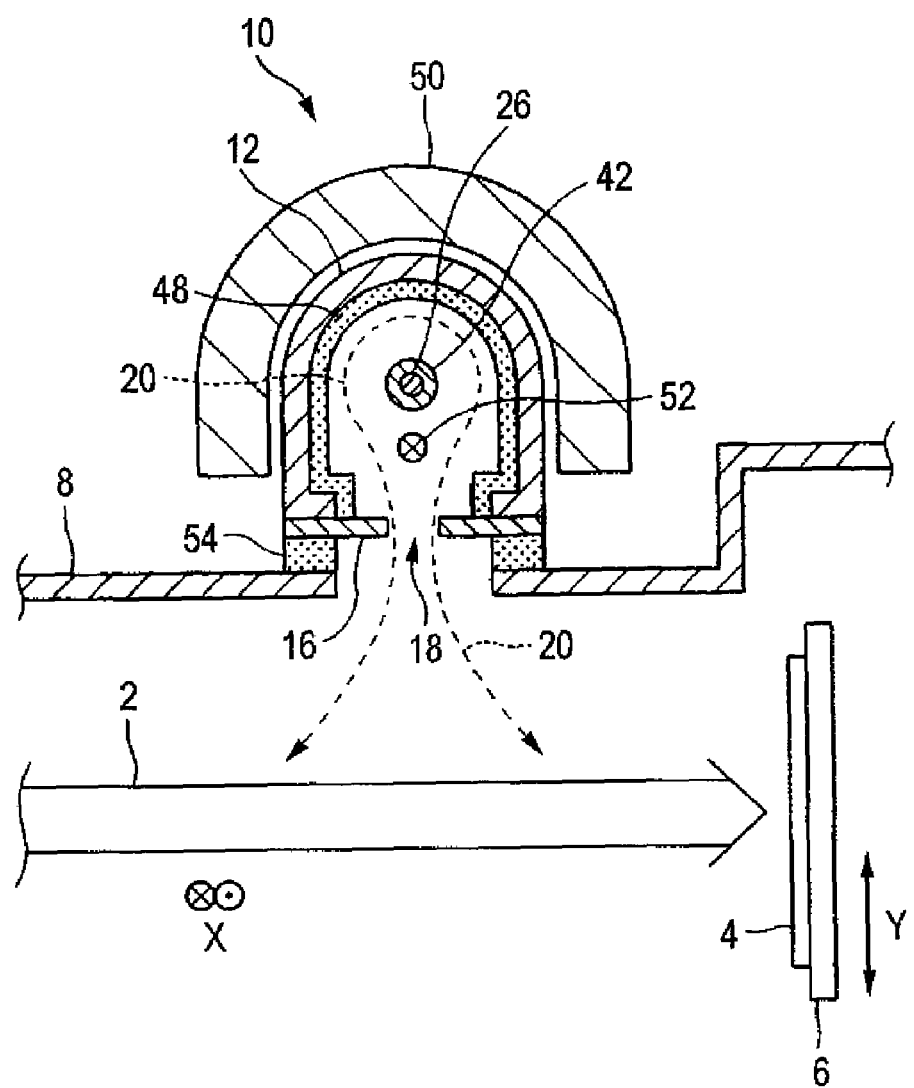
FIG. 2 is a section view taken along the A-A line of FIGS. 1 and 6.

In FIGS. 1 and 2, a plasma generating apparatus 10 is used in an ion beam radiating apparatus (refer to as an ion implantation apparatus when it is used for an ion implantation processing) which radiates an ion beam 2 onto a substrate 4 (for example, a semiconductor substrate) within a vacuum container 8 to enhance an ion implantation processing on the substrate 4. The plasma generating apparatus 10 is mounted by an insulator 54 on the outside of the vacuum container 8 which is situated in the vicinity of the upstream side of the substrate 4.

The ion beam 2 is reciprocatingly scanned in the X direction (for example, in the horizontal direction) by an electric field or by a magnetic field. The substrate 4 is held by a holder 6 and is reciprocatingly scanned in the Y direction which crosses in the X direction (for example, in the vertical direction) mechanically. Cooperation (hybrid scan) of the two scanning operations makes it possible to radiate the ion beam 2 onto the entire surface of the substrate 4 with high uniformity to carry out a highly uniform ion implantation.

In this case, when a plasma 20 discharged from the plasma generating apparatus 10 is supplied to the vicinity of the ion beam 2 or substrate 4 to neutralize positive charges which are generated by the ion beam radiation using electrons contained in the plasma 20, the charge-up of the surface of the substrate 4 may be controlled.

The plasma generating apparatus 10 is structured such that it extends in the X direction in order to be able to correspond to the scanning of the ion beam 2 in the X direction. Owing to this structure, the plasma generating apparatus 10 may discharge the plasma 20 having a large width in the X direction and thus may supply the plasma 20 equally to the vicinity of the ion beam 2 to be scanned in the X direction. Therefore it is possible to control the charge-up of the surface of the substrate 4 equally.

The plasma generating apparatus 10 includes a cylindrical (specifically, semi-cylindrical)-shaped plasma generating container 12 which extends along the X direction. This plasma generating container 12 is formed of non-magnetic materials so as not to disturb a magnetic field 52 that is provided by a magnet 50 (which will be described later). An electrode 16 is also formed similarly to the plasma generating container 12.

A gas introduction pipe 22 connects to one end face (in FIG. 1, the left side) of the plasma generating container 12.

Gas 24 is put into the plasma generating container 12 from the gas introduction pipe 22. The gas 24 is, for example, xenon gas.

The plasma generating container 12 includes an opening 14 in a portion thereof, specifically, in the side surface of the lower side thereof (the side thereof that faces the ion beam 2). In the opening 14, there is provided the electrode 16 having a plasma discharge hole 18 through which the plasma 20 generated within the plasma generating container 12 may be taken out to the outside. The plasma discharge hole 18 is composed of a plurality of holes (for example, circular holes or elliptical holes) which are arranged side by side in the X direction. However, it may also be a slit which extends in the X direction. The electrode 16 is electrically connected to the plasma generating container 12 and is equal in potential to the plasma generating container 12.

Instead of providing the opening 14 and electrode 16, the plasma discharge hole 18 may also be formed directly on the side surface of the plasma generating container 12.

Within the plasma generating container 12, there is provided a bar-like straight antenna 26 which extends along the longitudinal axis of the plasma generating container 12, that is, in the X direction. The length of the antenna 26 within the plasma generating container 12 is, for example, about 80% 100% of the axial direction of the plasma generating container 12. Specifically, the antenna 26 is inserted into the plasma generating container 12 from the other (in FIG. 1, the right side) end face of the plasma generating container 12. The antenna 26 is made of tungsten or the like. The antenna 26 and plasma generating container 12 are electrically insulated from each other by an antenna cover 42 or other insulator (not shown).

To the antenna 26, there is supplied a high frequency wave 28 from a high frequency power supply 30 through an impedance matching circuit 32 and a coaxial cable 34. The high frequency wave 28 may be, for example, a high frequency wave of the order of 13.56 MHz or a microwave of the order of 2.45 GHz. That is, in the present specification, the term "high frequency wave" is used based on a wide concept containing the microwave as well. The center conductor 36 of the coaxial cable 34 is electrically connected to the antenna 26, while the outer peripheral conductor 38 thereof is electrically connected to the plasma generating container 12.

According to the structure, the high frequency wave 28 supplied from outside to the antenna 26 may be radiated from the antenna 26 into the plasma generating container 12 and the gas 24 may be ionized due to high frequency discharge within the plasma generating container 12, thereby being able to generate the plasma 20. And, this plasma 20 may be taken out through the plasma discharge hole 18 into the vacuum container 8.

A negative extraction voltage VE may be applied with the potential of the vacuum container 8 as a reference. The negative extraction voltage VE may be applied from a DC extraction power supply 56 to the plasma generating container 12 and electrode 16 in equal potential to the plasma generating container 12. In this case, electrons may be easily discharged from the plasma discharged hole 18 and thus the plasma 20 may be easily discharged.

The whole of the antenna 26 situated within the plasma generating container 12 is covered with an antenna cover 42 which is made of an insulator such as quartz. This may prevent the occurrence of metallic contamination which is caused when the metal particles of the antenna 26 are discharged due to the sputtering of the plasma 20.

The inner wall (that is, the inner wall except for the opening 14) of the plasma generating container 12, preferably, may also be covered with an insulator 48 as in the present embodiment. When the electrode 16 is not provided but the plasma discharge hole 18 is formed in the side surface of the plasma generating container 12, the inner wall of the plasma generating container 12 may be preferably covered with the insulator 48. This may prevent the occurrence of metallic contamination which is caused when the metal particles of the antenna 26 are discharged due to the sputtering of the plasma 20. However, since the invention relates to the detection of the fusion of the antenna cover 42, provision of the insulator 48 is not essential to the invention.

On the outside of the plasma generating container 12, there may also be provided a magnet 50 which generates a magnetic field 52 in a direction along the axis of the plasma generating container 12 within the plasma generating container 12. This magnet 50, in this example, has a semi-cylindrical shape extending along the plasma generating container 12. The magnet 50 is typically made of a permanent magnet. When the magnet 50 is provided within the plasma generating container 12, a magnetic field 52 generated by the magnet 50 catches electrons, thereby being able to facilitate the generation and maintenance of the plasma 20 within the plasma generating container 12. Owing to this, the plasma 20 may be generated in higher density.

Between the antenna 26 and plasma generating container 12, there is connected a DC voltage measuring device 60 which is used to measure a DC voltage VD between them. Since the antenna 26 and plasma generating container 12 are respectively connected electrically to the center conductor 36 and outer peripheral conductor 38 of the coaxial cable 34, the DC voltage measuring device 60 may also be connected between the center conductor 36 and outer peripheral conductor 38. Also, as described above, since the plasma generating container 12 and electrode 16 are electrically connected to each other and are equal in potential to each other, there is no need to distinguish them from each other electrically. This may apply similarly to FIG. 6 as well.

Figure 3:
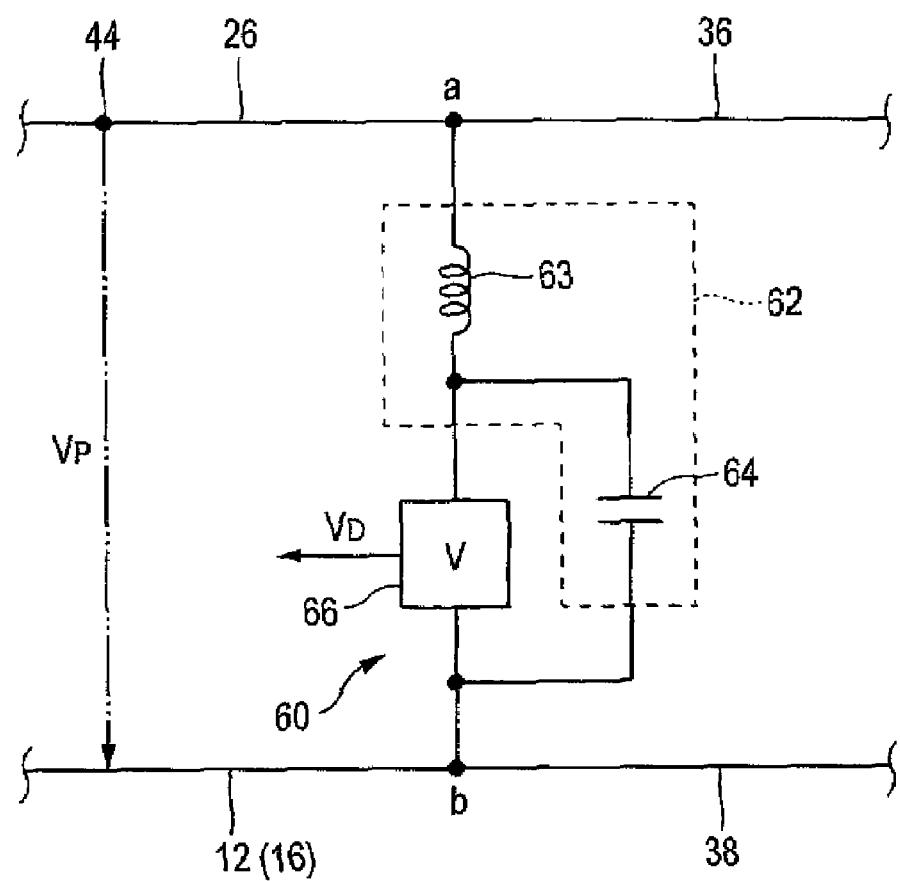
FIG. 3 is a circuit diagram of an electric circuit around a DC voltage measuring device of FIG. 1.

FIG. 3 shows an example of an electric circuit around the DC voltage measuring device 60. Connecting points a and b shown in FIG. 3 are the same as connecting points a and be shown in FIG. 1. The DC voltage measuring device 60 includes a low pass filter 62 which prevents the pass of a high frequency wave but allows a direct current to pass therethrough, a DC voltmeter 66 which measures a DC voltage VD having passed through the low pass filter 62 and outputs a signal expressing the measured DC voltage VD. Owing to the existence of the low pass filter 62, the DC voltage measuring device 60 provides very large impedance with respect to a high frequency wave. Therefore, even when the DC voltage measuring device 60 is provided, the existence of the DC voltage measuring device 60 has not a great influence on the input of the high frequency wave 28 into the plasma generating container 12. This applies similarly to a structure in which a DC resistance measuring device 70 (which will be discussed later).

The low pass filter 62 includes a coil 63 connected in series to the DC voltmeter 66, and a capacitor 64 connected in parallel to the DC voltmeter 66. However, the structure of the low pass filter 62 is not limited to this, but, for example, the capacitor 64 may not always be provided. This applies similarly to FIG. 7 which will be discussed later.

Referring again to FIG. 1, the DC voltage VD measured by the DC voltage measuring device 60 is applied to a comparator 80. The comparator 80 compares the DC voltage VD with a given reference value (reference voltage) VR and, when the absolute value of the former VD is larger than the absolute value of the latter VR, outputs an alarm signal SW.

When the antenna cover 42 is fused for the reason, for example, when fusion occurs in the portion 44 of the antenna cover 42 shown in FIG. 1, the plasma 20 is allowed to touch the antenna 26 in the fused area 44, whereby, in the antenna 26, there is generated a DC voltage VD equivalent to the potential (plasma potential) VP of the plasma (See FIG. 3).

Figure 4:
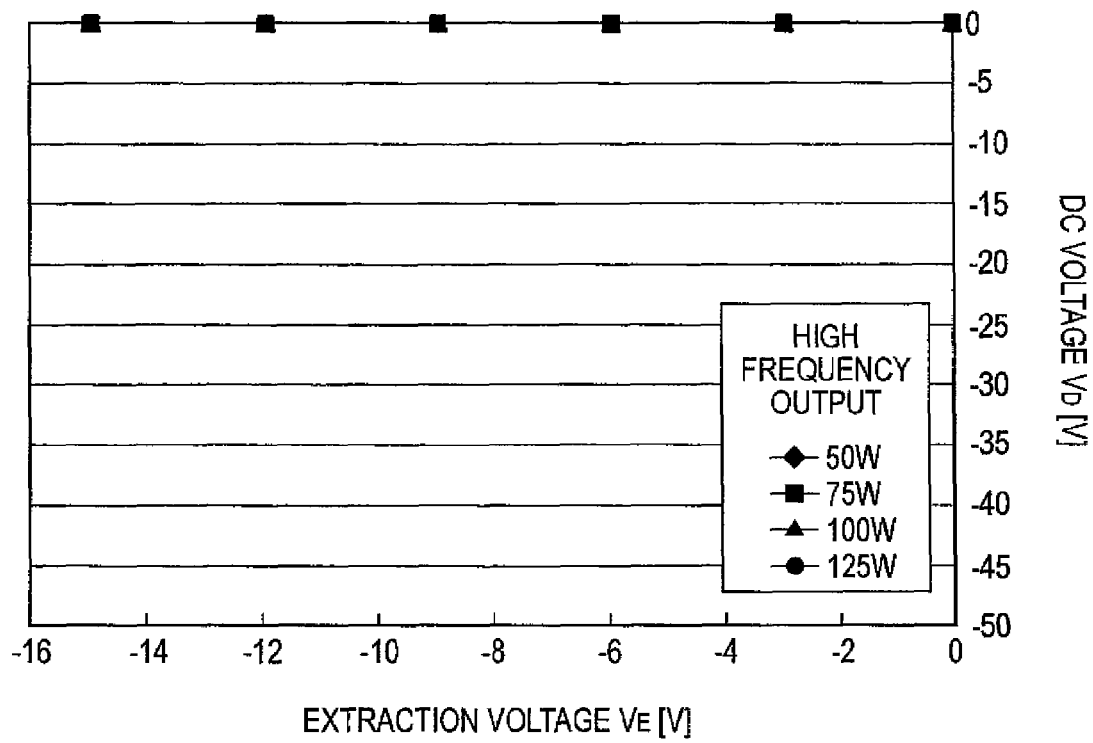
FIG. 4 is a graphical representation of results obtained by measuring the DC voltage when an antenna cover is normal.
Figure 5:
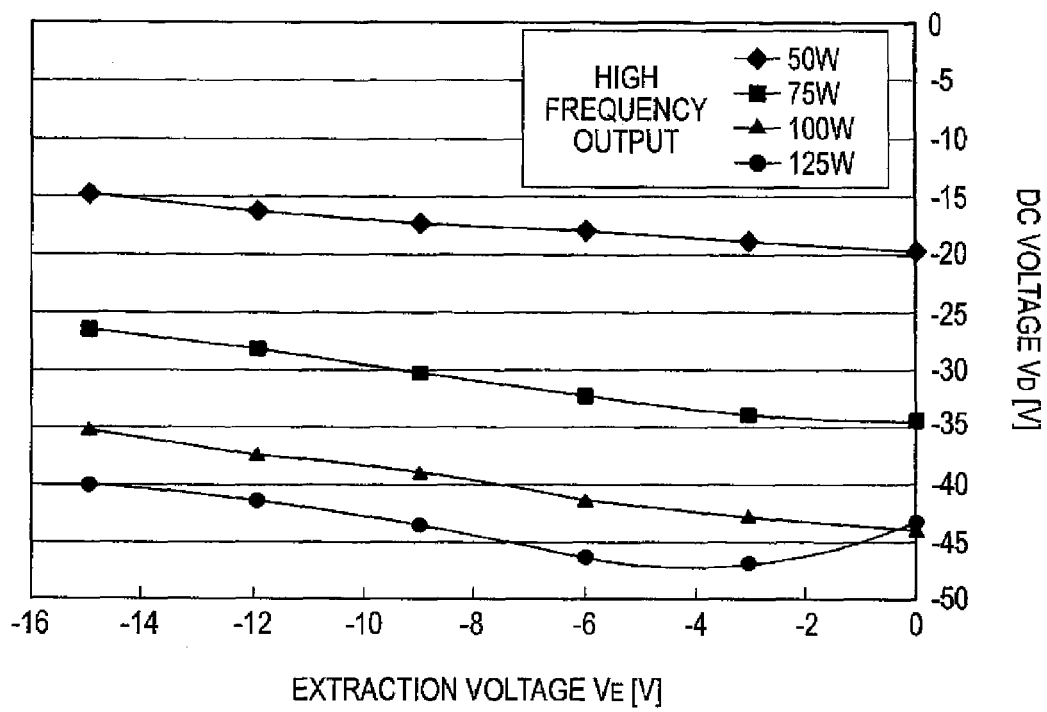
FIG. 5 is a graphical representation of results obtained by measuring the DC voltage when the antenna cover is fused.

A general book often describes that, on the assumption of a simple structure, the polarity of the plasma potential VP is positive with the plasma generating container 12 as a reference. However, the result of an experiment conducted by using the present plasma generating apparatus 10 has shown that it is negative with the plasma generating container 12 as a reference. Although the reason for this has not been investigated, it is supposed that the motion of electrons moving along the magnetic field 52 is related to this. The DC voltage VD equivalent to this plasma potential VP is measured by the DC voltage measuring device 60. FIG. 5 shows an example of the measured results. High frequency outputs shown in FIG. 5 are the outputs of the high frequency waves 28 from the high frequency power supply 30, while extraction voltages EV are the output voltages of the extraction power supply 56 (this applies similarly to the results shown in FIG. 4 as well). In this example, there is measured a DC voltage VD in the range of −15V~−45V.

On the other hand, when the antenna cover 42 is normal, that is, when no fused area is found in the antenna cover 42, since the whole of the antenna 26 is covered with the antenna cover 42, there is no possibility that the plasma 20 may touch the antenna 26 and thus the DC voltage VD is not generated in the antenna 26. That is, the DC voltage VD, which is measured by the DC voltage measuring device 60, provides substantially 0 V. FIG. 4 shows an example of the measured results.

Therefore, when, by setting the reference value VR, for example, in the range of −1V~−5V, the fused area 44 is produced in the antenna cover 42, the DC voltage VD measured by the DC voltage measuring device 60 is larger in the negative side than the reference value VR, that is, the absolute value of the DC voltage VD is larger than the absolute value of the reference value VR, whereby there is output an alarm signal SW from the comparator 80.

While the polarity of the plasma potential VP depends on the structure of the plasma generating apparatus 10. It may be positive or negative. And the polarity of the reference value VR may be decided according to the polarity of the plasma potential VP. For example, when the plasma potential VP is positive reversely to the example, the reference value VR may also be a given voltage of a positive polarity.

According to the present plasma generating apparatus 10, since it includes the DC voltage measuring device 60 and comparator 80, it may detect immediately the fusion of the antenna cover 42 and thus output the alarm signal SW. This may prevent the occurrence of metallic contamination that is caused when the antenna 26 is sputtered with the plasma 20.

Second Embodiment

Figure 6:
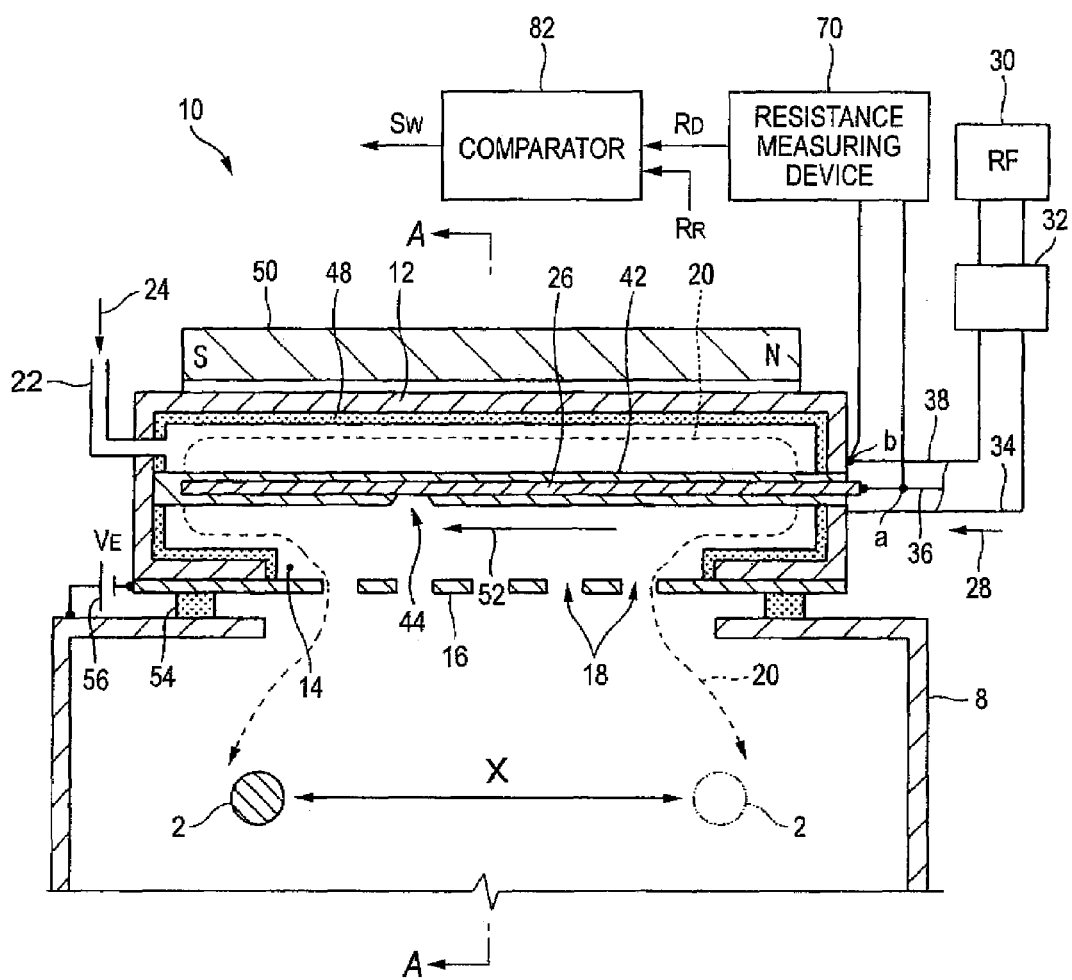
FIG. 6 is a section view of second embodiment of a plasma generating apparatus.

Now, FIG. 6 is a section view of second embodiment of a plasma generating apparatus according to the invention. Description will be given mainly of the portions thereof that are different from the first embodiment shown in FIG. 1. Specifically, in the present plasma generating apparatus 10, between the antenna 26 and plasma generating container 12, there is connected a DC resistance measuring device 70 which is used to measure a DC resistance RD between them.

Figure 7:
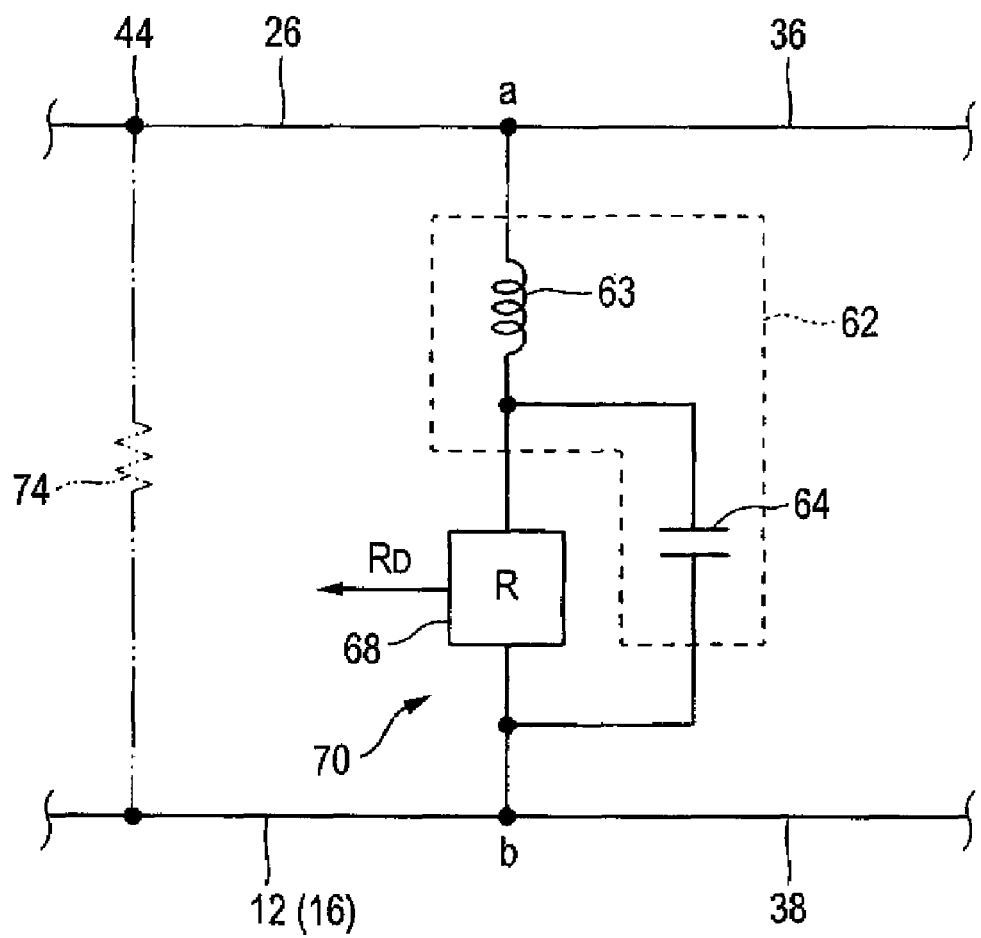
FIG. 7 is a circuit diagram of an electric circuit around a DC resistance measuring device of FIG. 6.

FIG. 7 shows an electric circuit around the DC resistance measuring device 70. This DC resistance measuring device 70 includes the low pass filter 62 and a DC ohmmeter 68 which is used to measure the DC resistance RD from a direct current having passed through the low pass filter 62 and output a signal for expressing the measured DC resistance RD.

The DC resistance RD measured by the DC ohmmeter 70 is applied to a comparator 82. The comparator 82 compares the DC resistance RD with a given reference value (reference resistance value) RR and, when the former RD is smaller than the latter RR, it outputs an alarm signal SW.

When the antenna cover 42 is fused for the reason, the plasma 20 is allowed to touch the antenna 26 in the fused area 44 of the antenna cover 42 and allows the antenna 26 and electrode 16, namely, plasma generating container 12 to conduct electrically to each other. Therefore, the DC resistance RD between the antenna 26 and plasma generating container 12 is reduced down to a very small value. That is, there is provided a state equivalent to the state of an electric circuit in which, as shown by a two-dot chained line in FIG. 7, the antenna 26 and plasma generating container 12 are connected to each other by a resistor 74 having a very small resistance value. The then DC resistance RD is measured by the DC resistance measuring device 70. In this case, the DC resistance RD is, for example, in the range of several $\Omega$~ten and several $\Omega$ or less.

On the other hand, when the antenna cover 42 is normal, that is, when no fused area is present in the antenna cover 42, the whole of the antenna 26 is covered with the antenna cover 42 and there is not generated the electric conduction between the plasma generating container 12 and antenna 26 through the plasma 20. Therefore, the antenna 26 is floating in direct current terms and thus the DC resistance RD measured by the DC resistance measuring device 70 is very large. That is, since, between the antenna 26 and plasma generating container 12, there are interposed the antenna cover 42 and other insulators, the direct current resistance thereof is very large. Also, direct current resistance, which exists on the side of the coaxial cable 34, impedance matching circuit 32 and high frequency power supply 30, is very large for the following reason that, normally, the impedance matching circuit 32 includes a series capacitor therein. Therefore, in this case, the direct current resistance RD provides, for example, several hundreds of k$\Omega$~several M$\Omega$ or more.

Accordingly, when, by setting the reference value RR in the range of 1 k$\Omega$~5 k$\Omega$ or so, the fused area 44 is generated in the antenna cover 42, the direct current resistance RD measured by the DC resistance measuring device 70 is smaller than the reference value RR, so that there is output an alarm signal SW from the comparator 82.

That is, according to the present plasma generating apparatus 10, since it includes the DC resistance measuring device 70 and comparator 82, it may immediately detect the fusion of the antenna cover 42 and thus may output the alarm signal SW. This may prevent the occurrence of metallic contamination that is otherwise possibly caused when the antenna 26 is sputtered with the plasma 20.

Although description has been given heretofore in detail of the structures of the respective portions of the plasma generating apparatus 10, these structures are only examples and the invention is not limited to the structures that have been described hereinbefore in detail.

What is claimed is:

1. A plasma generating apparatus for ionizing gas by high frequency discharge within a plasma generating container to thereby generate a plasma and for discharging the plasma to the outside through a plasma discharge hole, the plasma generating apparatus comprising:
    an antenna, whose opposite end of a high frequency input end is open end, disposed within the plasma generating container for radiating a high frequency wave;
    an antenna cover made of an insulator and covering a whole of the antenna;
    a DC voltage measuring device for measuring a DC voltage between the antenna and the plasma generating container; and
    a comparator for comparing the DC voltage with a reference value, and outputting an alarm signal when an absolute value of the DC voltage value is larger than the absolute value of the reference value.

2. A plasma generating apparatus for ionizing gas by high frequency discharge within a plasma generating container to thereby generate a plasma and for discharging the plasma to the outside through a plasma discharge hole, the plasma generating apparatus comprising:
    an antenna, whose opposite end of a high frequency input end is open end, disposed within the plasma generating container for radiating a high frequency wave;
    an antenna cover made of an insulator and covering a whole of the antenna;
    a DC resistance measuring device for measuring a DC resistance between the antenna and the plasma generating container; and
    a comparator for comparing the DC resistance with a reference value, and outputting an alarm signal when an absolute value of the DC resistance is smaller than an absolute value of the reference value.

* * * * *